(12) United States Patent
Nelson

(10) Patent No.: US 8,011,648 B1
(45) Date of Patent: Sep. 6, 2011

(54) CLAMP FOR HOLDING WORK-PIECES OF ANY SIZE UPON A PALLET SUPPORT TABLE

(76) Inventor: Lance Nelson, Hudson, MA (US)

( * ) Notice: Subject to any disclaimer, the term of this patent is extended or adjusted under 35 U.S.C. 154(b) by 1264 days.

(21) Appl. No.: 11/387,609

(22) Filed: Mar. 23, 2006

(51) Int. Cl.
*H01L 21/683* (2006.01)
(52) U.S. Cl. .................. 269/305; 269/95; 269/138
(58) Field of Classification Search .............. 269/305, 269/289 R, 95, 138
See application file for complete search history.

(56) References Cited

U.S. PATENT DOCUMENTS

| | | | | |
|---|---|---|---|---|
| 2,587,025 | A | * | 2/1952 | Beck et al. ............. 269/146 |
| 4,805,888 | A | * | 2/1989 | Bishop ................... 269/99 |
| 5,310,299 | A | | 5/1994 | Bernstein |
| 5,624,106 | A | * | 4/1997 | Weber ................... 269/138 |
| 5,641,257 | A | * | 6/1997 | Bernstein ............... 411/354 |
| 5,961,108 | A | * | 10/1999 | Weber ................... 269/138 |
| 6,062,541 | A | * | 5/2000 | Hampton ............... 254/98 |
| 6,158,728 | A | * | 12/2000 | Smith .................... 269/99 |

OTHER PUBLICATIONS

Series-9 Clamps, Internet AD, Mar. 20, 2006, 1 of 1, Mitee-Bite Products Co.
Tiny Vise Edge Clamps, Internet AD, Mar. 20, 2006, 1 and 2, carrlane.com/Catalog.

* cited by examiner

*Primary Examiner* — Lee D Wilson
(74) *Attorney, Agent, or Firm* — Robert Nathans

(57) ABSTRACT

An elongated clamping member upon a conventional pallet support table extends its clamping range by providing several screw-head receiving portions for receiving a conventional clamping screw that presses against a selected screw-head receiving portion to cause the clamping member to press against a work-piece. A first edge portion of the clamping member is positioned a first distance from a first screw-head receiving portion, and a second screw-head receiving portion is positioned a second distance from a second edge portion of the clamping member opposite the first edge portion, this difference ensuring that the clamping screw moves the clamping member in a forward direction toward the work-piece rather than away from the work-piece. A work-stop employing a conventional flat head screw has several peripheral flats, positioned at progressively increasing distances from each flat to a central portion of the work-stop member to further extend the clamping range of the moveable clamp.

28 Claims, 6 Drawing Sheets

CLAMP FOR HOLDING WORK-PIECES OF ANY SIZE UPON A PALLET SUPPORT TABLE

BACKGROUND OF THE INVENTION

Pallet work-piece support tables are commonly used in the manufacturing industry for many types of machining and measuring operations. These pallet work-piece tables contain an array of equally spaced threaded holes in which screws can be placed to hold parts in position. The parts can either be directly screwed down to the pallet table to be rigidly held in place or a clamp can be screwed down to the pallet table to hold the part in position. There are various types of clamps currently available that are able to be used on pallet work-piece support tables. One particularly useful type of clamp is commonly referred to as an edge clamp. Three different edge clamp designs have been developed and marketed for this particular application.

Bishop U.S. Pat. No. 4,805,888 uses an eccentrically shaped screw head to cause the clamp to be moved toward the work-piece when rotated. Rotating the eccentrically shaped screw causes the clamp to be moved toward the work-piece by only a small amount, typically around 0.050 inches. The work-piece must be sandwiched between the clamp and work-stop. The work-stop or the clamp must be precisely sized since the amount the clamp is capable of moving is so small. The clamps are produced in only a few specific sizes so the only way to use these types of clamps is to produce custom work-stops for each size work-piece that is to be produced. Alternately, specific pallet work-piece tables could be produced for each size work-piece but their costs are prohibitively high if only small quantities of work-pieces need to be produced, such as in producing prototypes.

Weber U.S. Pat. No. 5,624,106 developed a similarly shaped edge clamp that uses a standard tapered flathead screw instead of the eccentrically shaped screw. The tapered screw is inserted down into a similarly shaped hole in the clamp. The hole has a different angle on the backside of the tapered hole to allow some clearance for the screw. Threading the screw down into the hole of the clamp causes the clamp to be moved toward the work-piece by a similarly small amount, approximately 0.050 inches. As with the Bishop clamp, numerous sized work-stops or clamp sizes would be required to accommodate varying sizes of work-pieces.

Bernstein U.S. Pat. No. 5,310,299 developed a similarly shaped edge clamp that also uses a standard tapered flathead screw instead of the eccentrically shaped screw. The tapered screw is also inserted down into a similarly shaped hole in the clamp and tightened against the pallet work-piece support table. Departing from the Weber design, the hole has an equal angle on the backside of the tapered hole to allow clearance for the screw. Threading the screw down into the hole of the clamp causes the clamp to be moved toward the work-piece by a similarly small amount, approximately 0.050 inches. As with the Bishop and Weber clamps, numerous sized work-stops or clamp sizes would be required to accommodate varying sizes of work-pieces.

Mitee-Bite of Center Ossipee, N.H. manufactures a clamp that uses the Bishop U.S. Pat. No. 4,805,888 type eccentrically shaped screw head in their Series-9 Clamps. As in the other described Bishop design, these clamps move toward the work-piece by only a small amount. To help overcome this problem, they developed an odd shaped hex shape where the distance from the center of the clamp to each of the edges is slightly different. This allows for some additional travel of the clamp.

None of the above clamp designs are flexible enough to allow for various part sizes when used with a pallet work-piece support table that has equally spaced mounting holes. The clamps above are only capable of traveling approximately 0.050" towards the work-piece so either a custom size work-stop must be designed and used or a dedicated pallet work-piece support table must be created.

To overcome these deficiencies, a novel clamping apparatus was developed which is capable of traveling a large enough distance to hold parts of any size that are capable of fitting on a conventional pallet work-piece support table.

SUMMARY OF PREFERRED EMBODIMENTS OF THE INVENTION

An elongated clamping member, slideable upon a pallet support table, has several screw-head receiving portions formed therein for receiving a clamping screw that presses against a selected screw-head receiving portion that in turn causes the clamping member to press against a work-piece. This arrangement extends the range of operation of the clamp upon the support table.

A first edge portion of the elongated clamping member is positioned a first distance from a first screw-head receiving portion, and a second screw-head receiving portion is positioned a second distance from a second edge portion of the clamping member opposite the first edge portion, the difference between the first and second distances being equal to about half the distance between screw-head receiving portions positioned along the length axis of the clamping member to ensure that the clamping screw moves the clamping member in a forward direction toward the work-piece rather than away from the work-piece. This is ensured by manually turning the elongated clamp member around 180 degrees.

A preferred novel work-stop member co-acting with the moveable clamping member is odd shaped and has several side portions or flats positioned about a periphery of the work-stop member, the flats being positioned at progressively increasing distances from each flat to a central portion of the work-stop member by approximately 0.050 inches to further extend the clamping range of the moveable clamp-work-stop apparatus. The work-stop member is fixed in position upon the table by a standard non-elliptical flat head screw.

An edge portion of the movable clamp member can include an extremely thin fork-like member that extends from a bottom of the movable clamping member and contacts the work-piece table, enabling precise positioning of very thin circular or rectangular work-pieces.

A conical washer, mounted on the clamping screw, can also be provided, to press against a particular washer receiving portion of a set of hollowed out washer receiving portions beneath the screw-head receiving portions when the clamping screw is tightened, for enhancing the holding power of the clamp.

DESCRIPTION OF THE DRAWINGS

Other objects, features and advantages of the present invention will become more apparent upon reading of the following detailed description, taken in conjunction with the drawings in which.

DETAILED DESCRIPTION OF PREFERRED EMBODIMENTS OF THE INVENTION

Figure 1:
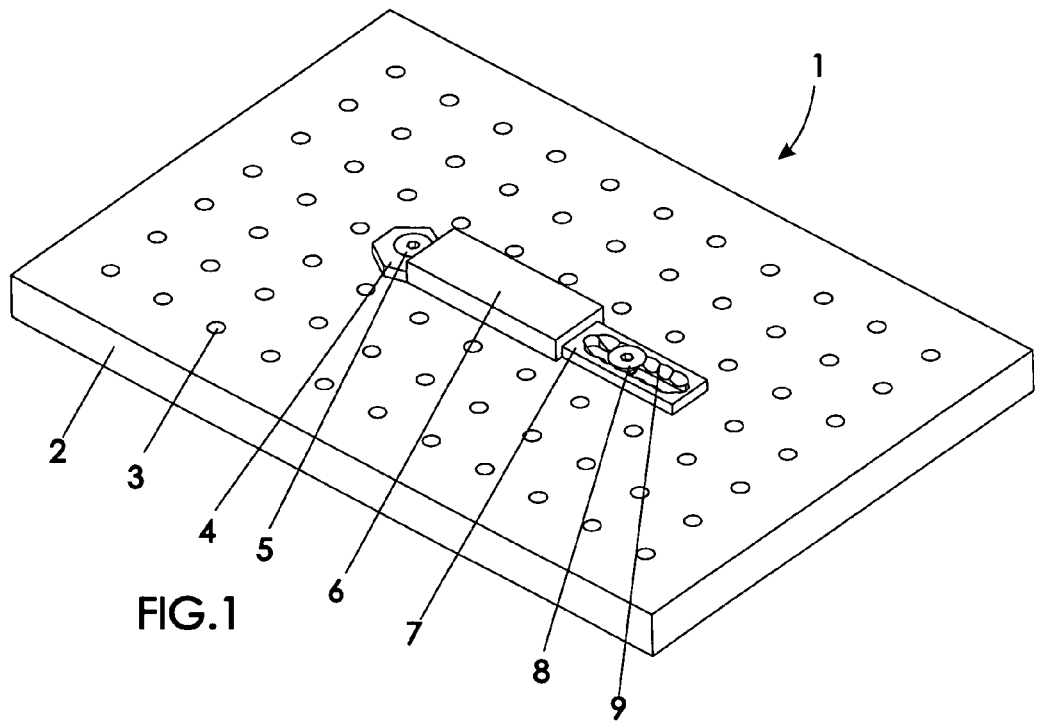
FIG. 1 is a perspective view of a pallet system showing a work-piece secured in place by a work-stop and a moveable clamp of a preferred embodiment of the invention.

The pallet work-piece support table 1 is shown in FIG. 1 having tapped holes 3 for receiving threaded work-piece alignment pins or work-stops 4 and screws 5. The work-piece 6 is held in place against the work-stop 4 by a moveable clamp 7 and its clamping screw 8. The threaded screws for the work-stops and clamps are screwed into the tapped holes 3 at selected places anywhere in the two-dimensional array of precisely positioned holes on the work-piece support table 2.

As the holes in an X-Y array of the pallet work-piece support table are precisely positioned, e.g. at one inch intervals, numerous types of work-pieces can be accurately positioned for machining under the control of a computerized numerically controlled (cnc) machine tool such as a grinding or milling machine. The moveable clamp 7 has a long central slot positioned along axis 7a shown in FIG. 2, within which the clamping screw 8 can be inserted, and allows the moveable clamp to be slideable on the table towards the work-piece 6. The moveable clamp 7 has several screw receiving portions 9, which can receive the clamping screw 8. The clamping screw 8 is typically a standard flat head shaped screw. Tightening the clamping screw 8 causes the screw head 12 to press against one of the receiving portions 9 which moves the moveable clamp 7 toward the work-piece 6. If the clamping screw lands on the forward side of a receiving portion 9 toward the work-piece 6, the moveable clamp moves forward towards the work-piece when the clamping screw is tightened. If the clamping screw lands on the rearward side of the receiving portion opposite the forward side, the moveable clamp moves away from the work-piece when the clamping screw is tightened, which of course is undesirable.

Figure 2:
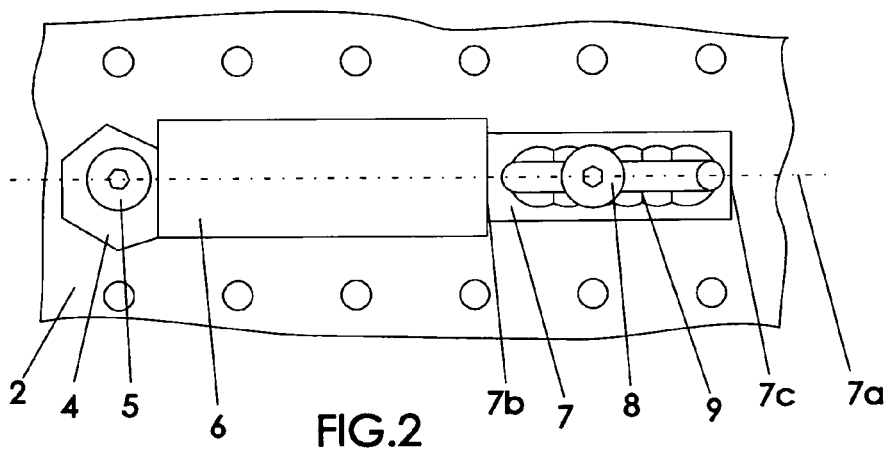
FIG. 2 is a top view of a pallet system showing a work-piece secured in place by a work-stop and a moveable clamp of FIG. 1.
Figure 4:
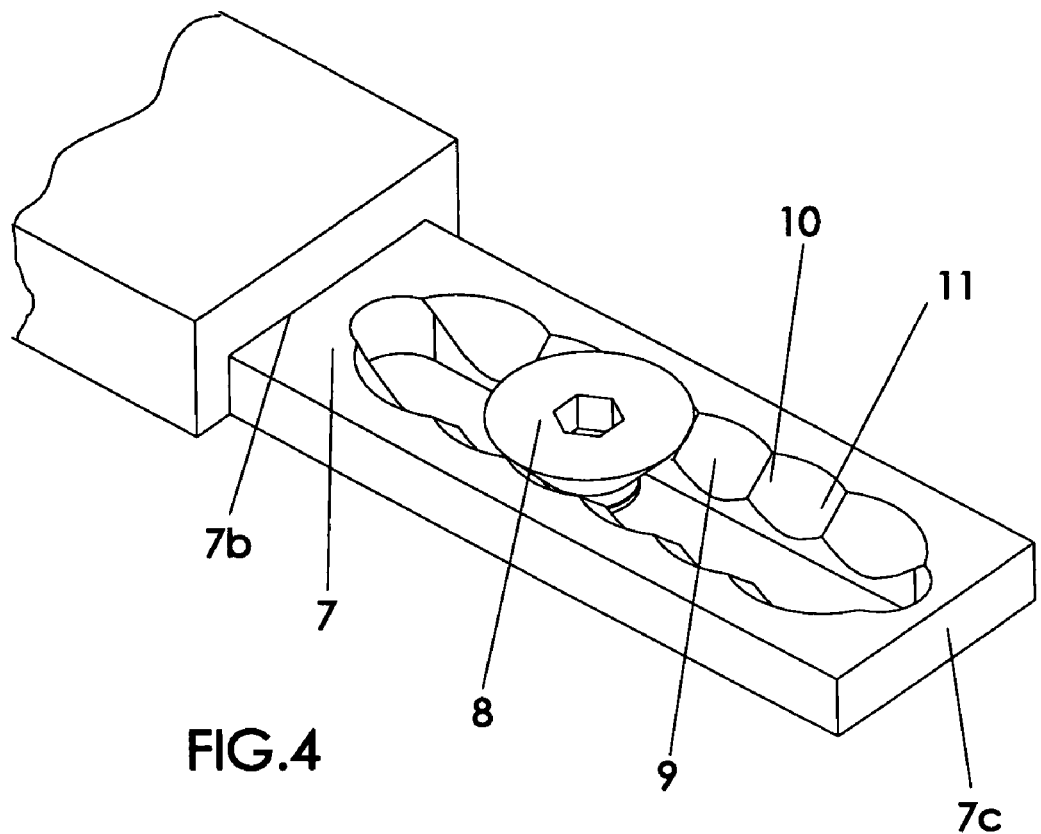
FIG. 4 is a detailed perspective view of the moveable clamp of FIG. 1.
Figure 5:
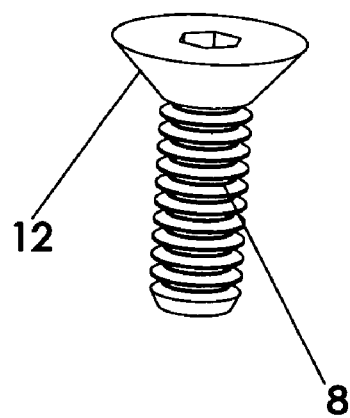
FIG. 5 is a detailed perspective view of the clamping screw used with the moveable clamp.
Figure 6:
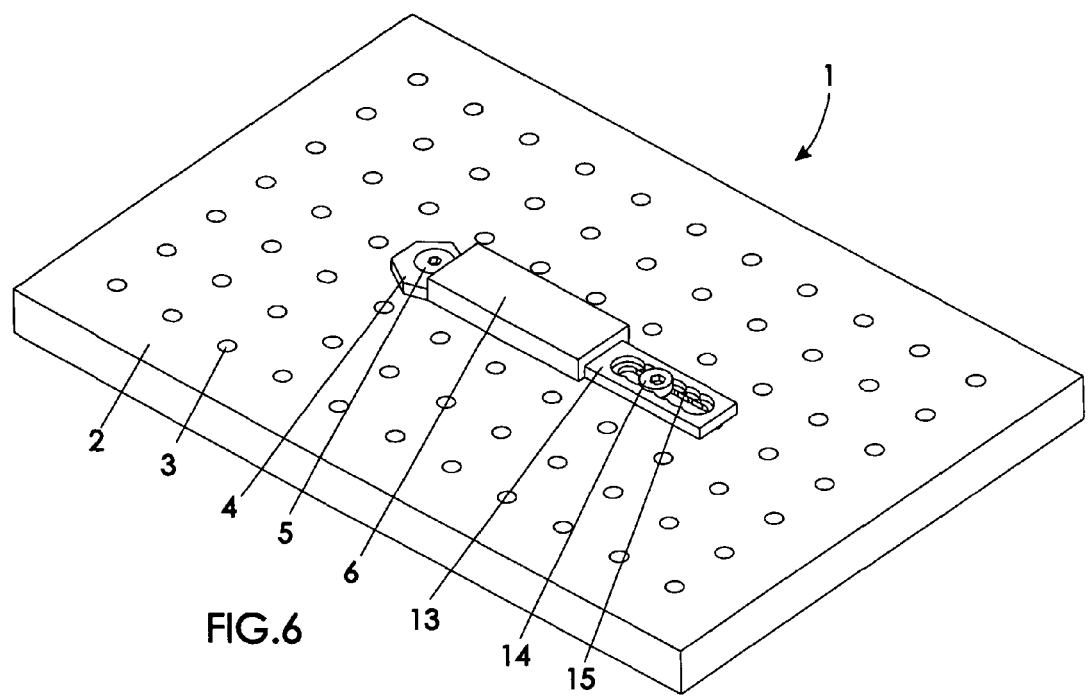
FIG. 6 is a perspective view of a pallet system showing a work-piece secured in place by a work-stop and a moveable clamp of a second embodiment of the invention.
Figure 7:
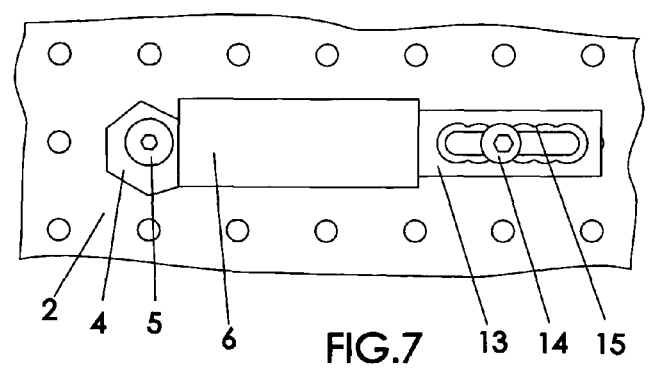
FIG. 7 is a top view of a pallet system showing a work-piece secured in place by a work-stop and a moveable clamp of FIG. 6.
Figure 8:
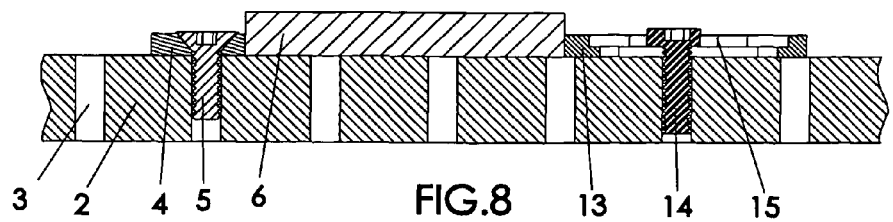
FIG. 8 is a sectional view of the pallet system showing a work-piece secured in place by a work-stop and a moveable clamp of FIG. 7.
Figure 9:
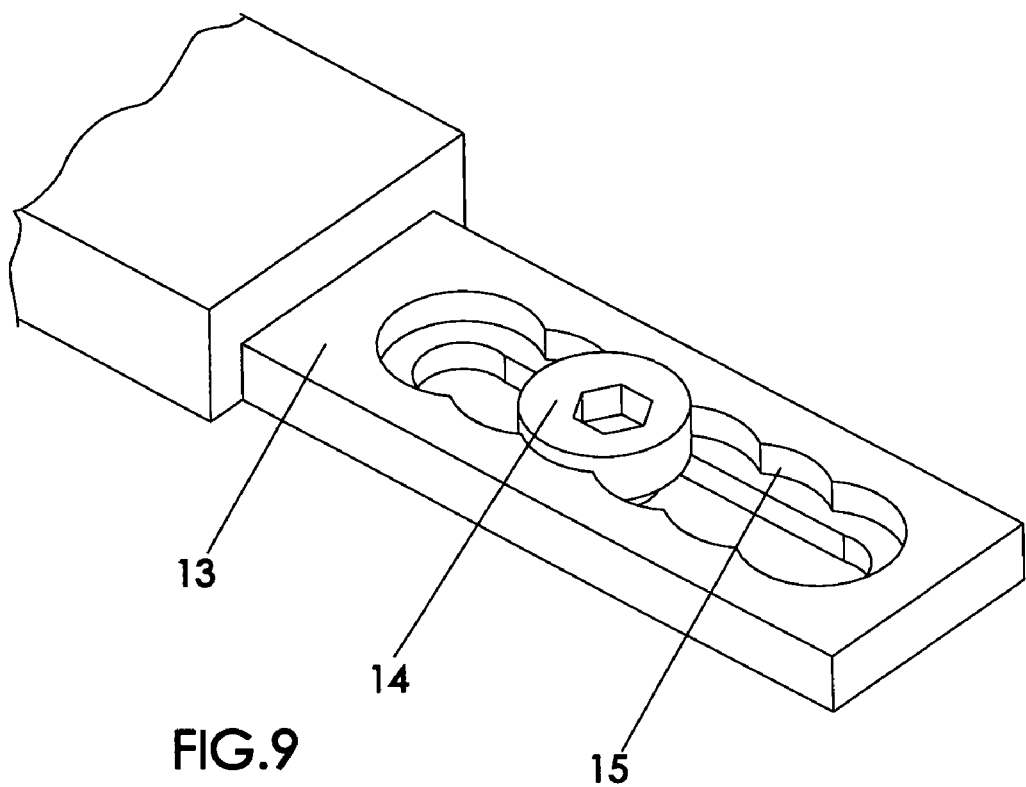
FIG. 9 is a detailed perspective view of the moveable clamp of FIG. 6.
Figure 10:
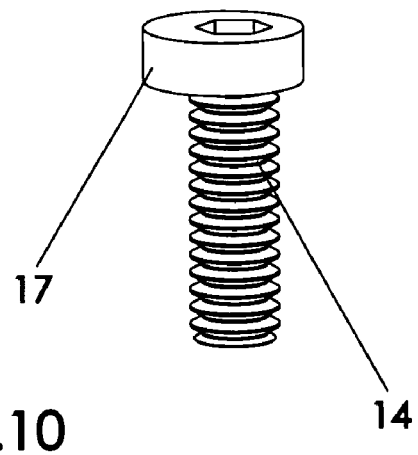
FIG. 10 is a detailed perspective view of the clamping screw used with the moveable clamp of FIG. 6.

The action of tightening the clamping screw down towards the work-piece support table slides the moveable clamp forward towards the work-piece typically by a relatively small amount, approximately 0.050 inches. The spacing between each of the screw head receiving portions 9 is greater than 0.050 inches, typically 0.1 inches to 0.3 inches. Therefore to accommodate different size work-pieces 6, the distance from the side of the moveable clamp at area 7b to the first screw head receiving portion 9 is different on each end of the moveable clamp at areas 7b and 7c as shown in FIGS. 2 and 4. The difference in these distances at 7b and 7c is about equal to half of the distance between the receiving portions 9. This allows the moveable clamp to be positioned in the proper location, by turning it around 180 degrees, so that when the clamping screw 8 is tightened against a receiving portion 9, the moveable clamp moves toward the work-piece instead of away from the work-piece.

Additionally, either different sized work-stops or my novel odd shaped work-stop 4, that has different spacing from the center of the work-stop to each of the work-stop sides or flats, may be used to more precisely position the clamping screw into the correct position with respect to a screw head receiving portion. The distance between each of the work-stop sides to the work-stop center is different by the approximate distance that the moveable clamp is able to move when the clamping screw is tightened, approximately 0.050".

An alternative method of causing the clamp to move toward the work-piece is shown in FIGS. 6-10. Instead of a clamping screw with a standard tapered flat head shape, this alternative method uses a clamping screw 14 with an offset cam shaped head 17 similar to the aforesaid Bishop U.S. Pat. No. 4,805,888 design. The cam shaped head 14 fits into one of the receiving areas 15. When the clamping screw is tightened, the moveable clamp moves back and forth towards and away from the work-piece. To hold the work-piece 6 in position, the clamping screw is rotated so that the moveable clamp 13 is firmly pressed against the work-piece 6 which in turn presses against the work-stop 4. As with the design described by FIG. 1 to FIG. 5, this offset cam shaped screw-head design also only moves the clamp a small amount. Therefore, as with the previously described design, the distance from the edge of the moveable clamp to the screw head receiving area is different on each end of the moveable clamp, typically by one half the distance between receiving areas. Also, to be able to hold any sized work-piece on a pallet system work-piece support table with an array of equally spaced holes, the use of my novel odd shaped work-stop 4 is also desired.

Figure 11:
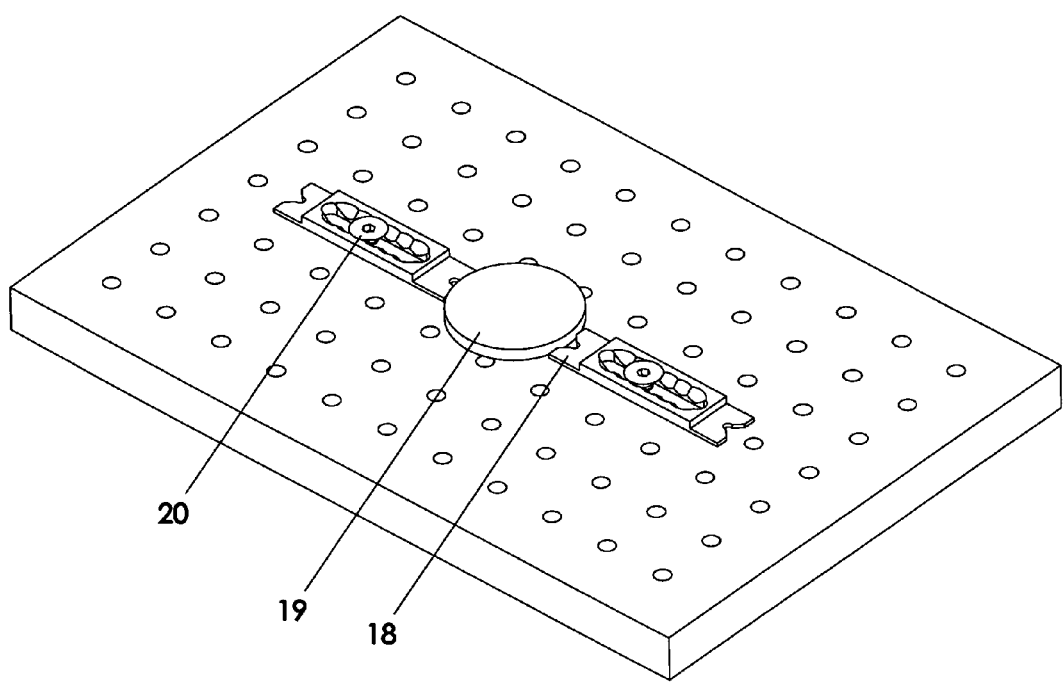
FIG. 11 is a perspective view of an alternate shaped moveable clamp holding a round work-piece.

The moveable clamp may be produced with various shapes to allow holding work-pieces with different shapes or configurations. FIG. 11 is an example of a shape that may be used to hold thin work-pieces without the moveable clamp protruding above the edge of the work-piece.

The ability of the moveable clamp to hold work-pieces without protruding above the work-piece edge is an important feature because it reduces possible interference during machining operations. This moveable clamp 18 variation is designed to hold either a rectangular work-piece on its corners or a circular shaped work-piece 19 on its diameter. The design of the moveable clamp allows the standard shape to have a very low profile. It is easily producible in heights less than 3/16 inches tall. Removing material adjacent to the ends of the moveable clamp allows thicknesses near the work-piece to be paper thin.

FIG. 11 also illustrates how my novel moveable clamp may also be used as a work-stop. By simply tightening the standard clamping screw 20, the moveable clamp becomes fixed in location on the pallet system work-piece support table and is a reliable variably positioned locating device.

As can be seen in FIG. 2, my novel work-stop member 4 is odd shaped and has several flats positioned about peripheral portions of the stop member, the flats being positioned at progressively increasing distances from each flat to a central portion of said stop member. My novel odd shaped work-stop member 4 is designed differently than the Mitee-Bite Series 9 Clamp that does not function as a work-stop.

Figure 3:
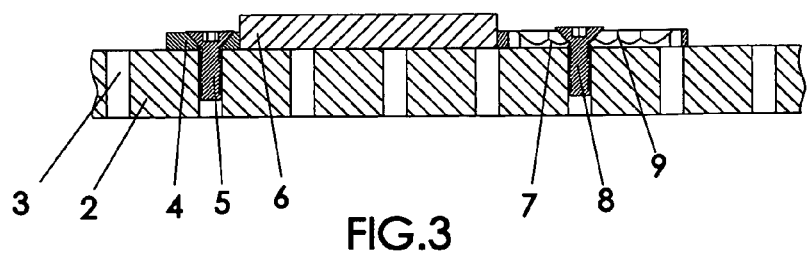
FIG. 3 is a sectional view of the pallet system showing a work-piece secured in place by a work-stop and a moveable clamp of FIG. 2.

As can be seen in FIG. 3, my work-stop member 4 preferably uses a standard flat head screw 5 that fits into a similarly shaped hole. Its tapered screw head fits into a similarly shaped tapered hole which provides repeatable locating properties. As the two tapers meet, they cause the work-stop member 4 to precisely center itself and provides for a large stable mating surface. In contrast, the standard counter-bored hole of the Mitee Bite Series 9 clamp will not center itself when a standard socket head cap screw is inserted into the hole and tightened. If a tapered flat head screw is inserted into the Series 9 clamp and tightened, it will only contact the top edge of the hole and the screw will protrude above the top surface of the clamp causing interference with the work-piece. Additionally, the single point of contact against the counter-bored hole does not provide for a strong repeatable mating surface. Thus, the Series 9 Clamp, using an eccentric cam shaped clamping screw, does not function as a reliable work-stop to meet my needs in the apparatus of FIGS. 1-3, described above. In my work-stop, a non-elliptical screw is positioned within a central portion of the work-stop member, permitting the odd shaped work-stop member to be rotated only, but not translated to function as a clamp, upon loosening of said non-elliptical screw.

The spacing between the screw head receiving portions will vary depending upon the size of the screw being used. In my current apparatus, I employ a small screw in conjunction with screw head receiving portions that are separated from each other by 0.25 inches, so that there are four receiving portions per linear inch along axis 7a of FIG. 2.

Figure 12:
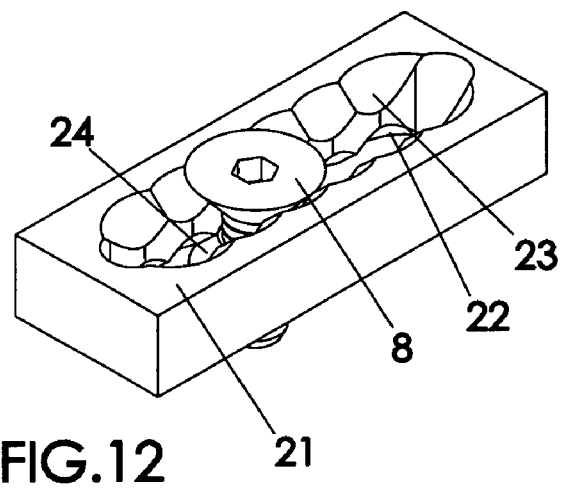
FIG. 12 is a perspective view of another embodiment of the invention with a second set of receiving areas on the underside of the moveable clamp.
Figure 13:
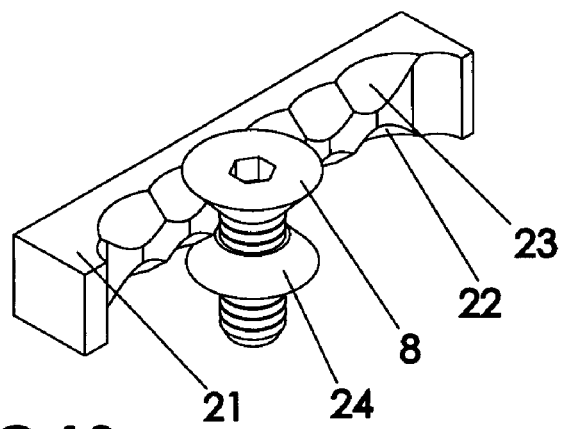
FIG. 13 is a detailed perspective view of the moveable clamp of FIG. 12 with the moveable clamp sectioned to allow viewing the underside of the clamp and the washer.
Figure 14:
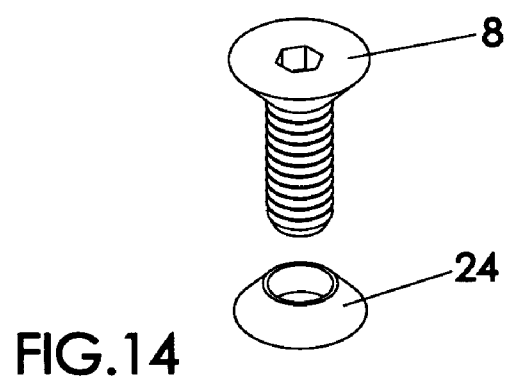
FIG. 14 is a detailed perspective view of the clamping screw and washer used with the moveable clamp of FIG. 12.

To increase the holding power of the clamps for heavier machining operations, a second plurality of receiving areas 22 are placed into the underside of the clamp 21 as can be seen in FIGS. 12, 13, and 14. The second plurality of receiving areas 22 have a similar shape as the receiving areas 23 on the topside of the clamp. A washer 24 which has a similar shape as the tapered flat head clamping screw head 8, is placed onto the screw on the underside of the clamp 21. When the clamping screw 8 is tightened, the clamp 21 is sandwiched between the head of the clamping screw 8 and the washer 24. This increases the amount of force applied to the clamp compared to one with a single receiving area.

Additionally, the bottom washer 24 spreads the force applied to the clamping screw 8 over a larger area of the screw and helps reduce the tendency of the clamping screw to bend from the sideways force applied to the screw if the screw is over tightened.

Adding this second plurality of receiving areas 22 to the underside of the clamp can cause the overall height of the clamp to be increased compared to a clamp with one set of receiving areas. This increased height may be undesirable in some machining operations, so there is a need for both versions of the clamps of the invention.

Since variations and modifications of the specification described will occur to those skilled in the art, the scope of the invention is to be limited solely by the terms of the claims and equivalents thereto. The term "screw-head" is intended to include a tapered washer or the like for pressing against sides of the screw-head receiving portions.

I claim:
1. Clamping apparatus comprising:
   (a) a work-piece support table having an array of precisely spaced threaded holes for receiving clamping screws therein;
   (b) an elongated clamping member having a longitudinal axis, and movable over said work-piece support table along said longitudinal axis for pressing an edge portion of said elongated clamping member against a work-piece upon said work-piece support table in turn pressed against a work-piece stop member; and
   (c) wherein a plurality of interconnected screw head receiving portions are formed within a slot within said elongated clamping member extending along said longitudinal axis for receiving a screw-head of a clamping screw that presses against a part of a particular selected screw-head receiving portion of said plurality of screw head receiving portions, that in turn causes a first edge portion of said clamping member to press against a work-piece upon said work-piece support table.

2. The clamping apparatus of claim 1 wherein a first edge portion of said clamping member is positioned a first distance from a first screw-head receiving portion, and wherein a second screw-head receiving portion is positioned a second distance from a second edge portion of said clamping member opposite said first edge portion, the difference between said first and second distances being equal to about half the distance between screw-head receiving portions positioned along the longitudinal axis of said clamping member, thereby to permit rotation of said clamping member to ensure that the clamping screw moves the clamping member in a forward direction toward the work-piece rather than away from the work-piece.

3. The clamping apparatus of claim 2 wherein said difference is about equal to the maximum distance the movable clamp is able to move as the clamping screw is tightened.

4. The clamping apparatus of claim 3 wherein said difference is about 0.05 inches.

5. The clamping apparatus of claim 1 wherein said clamping screw is a standard flat head shaped screw.

6. The clamping apparatus of claim 2 wherein said clamping screw is a standard flat head shaped screw.

7. The clamping apparatus of claim 3 wherein said clamping screw is a standard flat head shaped screw.

8. The clamping apparatus of claim 4 wherein said clamping screw is a standard flat head shaped screw.

9. The clamping apparatus of claim 1 wherein said clamping screw has an offset cam shaped head.

10. The clamping apparatus of claim 2 wherein said clamping screw has an offset cam shaped head.

11. The clamping apparatus of claim 3 wherein said clamping screw has an offset cam shaped head.

12. The clamping apparatus of claim 4 wherein said clamping screw has an offset cam shaped head.

13. Clamping apparatus comprising:
   (a) a work-piece support table having an array of precisely spaced threaded holes for receiving clamping screws therein;
   (b) a single elongated clamping member having a longitudinal axis, and movable over said work-piece support table along said longitudinal axis for pressing an edge portion of said single elongated clamping member against a work-piece upon said work-piece support table in turn pressed against a work-piece stop member, and
   (c) wherein a linear array of several screw head receiving portions are formed within a slot positioned along said longitudinal axis and within said single elongated clamping member for receiving a screw-head of only one clamping screw at a time that presses against a part of a particular selected screw-head receiving portion of said linear array of several screw head receiving portions, that in turn causes a first edge portion of said clamping member to press against a work-piece upon said work-piece support table.

14. The clamping apparatus of claim 13 wherein a first edge portion of said single elongated clamping member is positioned a first distance from a first screw-head receiving portion, and wherein a second screw-head receiving portion is positioned a second distance from a second edge portion of said single elongated clamping member opposite said first edge portion, the difference between said first and second distances being equal to about half the distance between screw-head receiving portions positioned along the longitudinal axis of said single elongated clamping member, thereby to permit rotation of said clamping member to ensure that the clamping screw moves the clamping member in a forward direction toward the work-piece rather than away from the work-piece.

15. The clamping apparatus of claim 13 wherein said clamping screw is a standard flat head shaped screw.

16. Clamping apparatus comprising:
   (a) a work-piece support table having an array of precisely spaced threaded holes for receiving clamping screws therein;
   (b) a clamping member movable over said work-piece support table having a longitudinal axis along the length thereof and having a first edge portion for pressing a work-piece against a work-piece stop member upon said work-piece support table; and
   (c) wherein a plurality of screw head receiving portions are formed within said clamping member along said longitudinal axis, for receiving a screw-head of a clamping screw that presses against a first part of a particular selected screw-head receiving portion of said clamping member, that in turn causes a fast edge portion of said clamping member to press against a work-piece upon said work-piece support table; and
   (d) an odd shaped work-piece stop member having several flats positioned about peripheral portions of the work-piece stop member, the flats being positioned at progressively increasing distances from each flat to a central portion of said work-piece stop member; and
   (e) wherein a non-elliptical screw is positioned within said central portion of said work-piece stop member, permitting said odd shaped work-piece stop member to be rotated, but not translated, upon loosening of said non-elliptical screw, enabling changing the positioning of said flats upon said pallet support table.

17. The clamping apparatus of claim 16 wherein a first edge portion of said single elongated clamping member is positioned a first distance from a first screw-head receiving portion, and wherein a second screw-head receiving portion is positioned a second distance from a second edge portion of said single elongated clamping member opposite said first edge portion, the difference between said first and second distances being equal to about half the distance between screw-head receiving portions positioned along the longitudinal axis of said single elongated clamping member, thereby to permit rotation of said single elongated clamping member to ensure that the clamping screw is able to move the single elongated clamping member in a forward direction toward the work-piece rather than away from the work-piece.

18. The apparatus of claim 16 wherein the distance between each of the work-piece stop member side portions to the work-piece stop center is different by the approximate distance that the moveable clamp is able to move when the clamping screw is tightened.

19. The apparatus of claim 17 wherein the distance between each of the work-piece stop member side portions to the work-piece stop center is different by the approximate distance that the moveable clamp is able to move when the clamping screw is tightened.

20. The clamping apparatus of claim 1 wherein said first edge portion for pressing a work-piece against a stop member includes a thin member that extends from a bottom portion of said movable single elongated clamping member and contacts said work-piece support table, enabling precise positioning of thin circular or rectangular work-pieces.

21. The clamping apparatus of claim 13 wherein said first edge portion for pressing a work-piece against a stop member includes a thin member that extends from a bottom portion of said movable single elongated clamping member and contacts said work-piece support table, enabling precise positioning of thin circular or rectangular work-pieces.

22. A work-piece stop member that can be mounted upon a pallet support table for supporting parts to be machined thereon comprising:
   (a) an odd shaped work-piece stop member having several flats positioned about peripheral portions of the work-piece stop member, the flats being positioned at progressively increasing distances from each flat to a central portion of said work-piece stop member; and
   (b) wherein a non-elliptical screw is positioned within said central portion of said work-piece stop member, permitting said odd shaped work-piece stop member to be rotated, but not translated, upon loosening of said non-elliptical screw, enabling changing the positioning of said flats upon said pallet support table.

23. The work-piece stop member of claim 16 wherein said non-elliptical screw comprises a tapered flat head screw.

24. The work-piece stop member of claim 22 wherein said non-elliptical screw comprises a tapered flat head screw.

25. The clamping apparatus of claim 1 wherein said clamping screw has a conical washer mounted thereon and wherein a second plurality of screw mounted washer receiving portions are formed within said clamping member along said longitudinal axis, for receiving said conical washer mounted upon said clamping screw that presses against a particular washer receiving portion of said clamping member.

26. The clamping apparatus of claim 2 wherein said clamping screw has a conical washer mounted thereon and wherein a second plurality of screw mounted washer receiving portions are formed within said clamping member along said longitudinal axis, for receiving said conical washer mounted upon said clamping screw that presses against a particular washer receiving portion of said clamping member.

27. The clamping apparatus of claim 13 wherein said clamping screw has a conical washer mounted thereon and wherein a second plurality of screw mounted washer receiving portions are formed within said clamping member along said longitudinal axis, for receiving said conical washer mounted upon said clamping screw that presses against a particular washer receiving portion of said clamping member.

28. The clamping apparatus of claim 14 wherein said clamping screw has a conical washer mounted thereon and wherein a second plurality of screw mounted washer receiving portions are formed within said clamping member along said longitudinal axis, for receiving said conical washer mounted upon said clamping screw that presses against a particular washer receiving portion of said clamping member.

* * * * *